May 14, 1957 J. P. ECKERT, JR 2,792,507

FORCIBLE REVERSION OF MAGNETIC AMPLIFIERS

Filed July 27, 1955

INVENTOR.
JOHN PRESPER ECKERT, JR
BY
Charles C. Englert
AGENT 2,792,507

FORCIBLE REVERSION OF MAGNETIC AMPLIFIERS

John Presper Eckert, Jr., Philadelphia, Pa., assignor to Sperry Rand Corporation, New York, N. Y., a corporation of Delaware Application July 27, 1955, Serial No. 524,705

16 Claims. (Cl. 307—88)

The present invention relates to magnetic amplifiers and is more particularly concerned with improved carrier type magnetic amplifiers. In particular, the present invention relates to carrier type magnetic amplifiers per se, or to circuits such as bistable devices using such amplifiers; and is concerned with so operating such amplifiers or amplifier devices that the fall time thereof is decreased considerably.

Carrier type magnetic amplifiers have, in the past, taken several possible basic forms of construction. One of the most useful types, where a component of output at signal frequency is required, is the series self-saturating type; and it is with this particular form of amplifier that the present invention is primarily concerned. In this type of amplifier, one or more cores may be utilized, each of which is coupled to a separate source of carrier voltage and to a common load. The carrier voltages are coupled to a diode in series with one winding on each such core, and these carrier voltages are generally so phased that the intervals between the starts of conduction of successive core windings are equal. Thus, there are half wave (single core), full wave (two-core), and three-phase (three-core) amplifiers of the foregoing series self-saturating type.

In many forms of such amplifiers or circuits utilizing such amplifiers, the fall time or "turn-off" period is substantially longer than the rise time or "turn-on" period of the amplifier. In many instances this long fall time is inherent in the amplification mechanism itself. In other forms of such amplifiers the long fall time is due to the form of signal input circuit heretofore employed. In either event, however, this relatively long fall time characteristic limits substantially the speed of operation of such amplifiers thereby restricting their utility. The present invention serves to obviate the foregoing difficulty and is concerned with amplifier devices, particularly of the carrier magnetic type, wherein the fall time of the amplifier may be decreased in comparison with similar amplifiers known heretofore; and, in addition, wherein the "turn-off" of the amplifier or devices using such amplifiers may be made substantially independent of signal sources employed.

It is accordingly an object of the present invention to provide an amplifier having improved operating characteristics.

A further object of the present invention resides in the provision of a magnetic amplifier having a shorter fall time than has been the case heretofore.

Still another object of the present invention resides in the provision of novel input circuits for carrier type magnetic amplifiers whereby the operating characteristics of such amplifiers are improved.

A still further object of the present invention resides in the provision of a novel bistable device having improved operating characteristics.

A further object of the present invention resides in the provision of a novel bistable device wherein signal pulses are not required for reversion of the said device to a predetermined stable state of operation.

A still further object of the present invention resides in the provision of an improved magnetic amplifier circuit which is more rugged in configuration and less subject to operating failures than has been the case heretofore.

In accordance with the present invention, improved operating characteristics for carrier type magnetic amplifiers may be effected by supplying auxiliary sources of control pulses coupled to a signal input winding for such an amplifier; and these pulses are in turn of such polarity and time relationship with respect to signal input pulses that the resultant amplifier is forcibly reverted to a "no-signal" output state upon cessation of a signal input. In accordance with the foregoing concepts, the control pulses utilized may serve to bypass current sources tending to cause current flow in the said signal or input winding in a predetermined direction, or may further cause a forcible current flow through the said signal or input winding in a direction reverse to that effected by signal inputs. By this arrangement, the operation of the amplifier is made substantially independent of the magnitude of signal input pulses during fall time periods of operation, or during reversion of bistable devices utilizing such amplifiers, whereby the speed of operation of the amplifier is increased substantially and the amplifier exhibits considerably improved operational characteristics.

The foregoing objects, advantages, construction and operation of the present invention will become more readily apparent from the following description and accompanying drawings in which.

Carrier type magnetic amplifiers in accordance with the present invention may, as discussed previously, utilize one or more cores of magnetic material. In the subsequent description, single-core magnetic amplifiers have been illustrated for ease of description, but it must be stressed that the principles to be discussed find ready utility in the other forms of amplifiers mentioned, as well as in devices utilizing such amplifiers.

Figure 1:
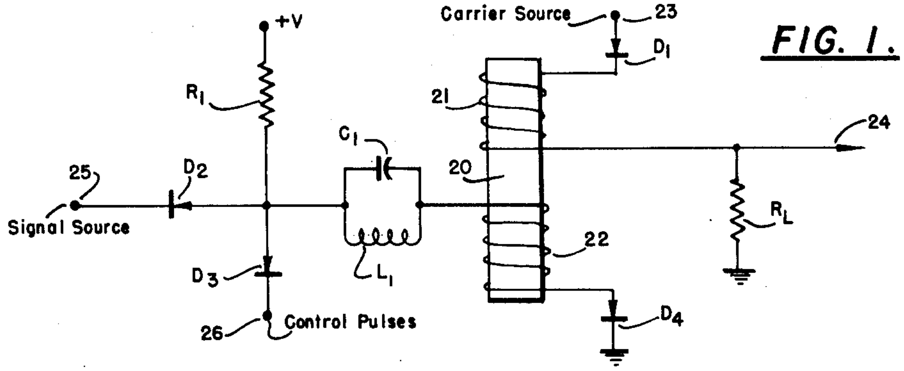
Figure 1 is a schematic diagram of a simple single-core carrier type magnetic amplifier constructed in accordance with the present invention.

Referring to Figure 1 such a single-core magnetic amplifier may comprise a core of magnetic material 20, preferably but not necessarily, exhibiting a substantially rectangular hysteresis loop. Core 20 carries a pair of windings thereon, namely, a power or output winding 21 and a signal or input winding 22. Output winding 21 is coupled at one of its ends via rectifier $D_1$ to a source of carrier potential 23 which may be sinusoidal, square-wave, or of other desired alternating configuration and having a frequency substantially higher than that of signal sources employed. The other end of the said output winding 21 is coupled to a load RL, whereby outputs may be taken selectively at an output point 24.

In accordance with one form of the present invention, the signal or input winding 22 may be coupled at one of its ends via a rectifier D4 to ground; and the other end of the said signal winding 22 may be coupled via filter $C_1$—$L_1$, (serving to keep carrier frequencies out of the signal circuit), to a constant current source comprising a potential source +V and a resistance $R_1$. The said constant current source +V—$R_1$ may be further coupled to a signal source 25 via a rectifier D2, poled as shown; and suitable bias sources (not shown) may be coupled to winding 22 and/or winding 21 to cause the said amplifier to operate at a predetermined output level for no-signal conditions.

In operation, and in the absence of signal inputs from the source 25, output potentials will appear at the point 24 due to the application of carrier frequencies from the source 23, which output potentials may lie anywhere between minimum and maximum output, depending upon the bias sources employed; and this operation is generally well known in the art. Assuming that the signal source coupled to terminal 25 exhibits a characteristic as shown in Figure 2B, namely, it provides selectively positive-going signal pulses from a base level of ground, it will be seen that in the absence of signal inputs at the said terminal 25, the current source $+V-R_1$ will tend to cause current flow through the rectifier D2 to the terminal 25 whereby substantially no current flows through the winding 22 and the device operates at its predetermined no-signal state. Upon application of a positive-going signal at the terminal 25, however, the anode potential of rectifier D2 rises, whereby current from the source $+V-R_1$ passes through the signal winding 22, providing the desired signal input to the amplifier.

If we should assume that the voltage of the signal pulse applied to terminal 25 is $+E$, the time required for current to reach a predetermined value I, in the winding 22, is proportional to $$\frac{LI}{E}$$

where L represents the inductance of the winding 22. This time to reach a specified current determines the use time of the output. For a relatively large value of signal input E, the input, and hence the output, rise times may be made fairly short. However, when the signal source coupled to terminal 25 returns to its zero base level, current from the source $+V-R_1$ will not immediately transfer back to rectifier D2 but will continue flowing through the winding 22 for a time interval substantially longer than the rise time of the amplifier, because of the relatively low (ground) potential available at terminal 25 for effecting this current transfer. Thus, neglecting for the moment the rectifier D3 and the control pulses coupled thereto, the particular carrier type magnetic amplifier shown in Figure 1 will be characterized by a relatively short rise time and a much longer fall time.

Figure 2:
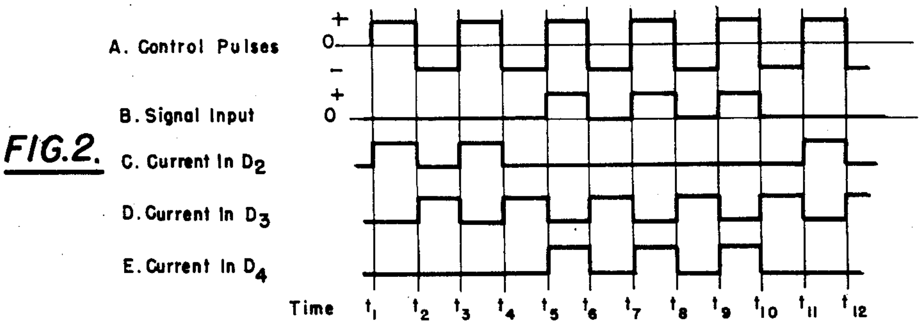
Figure 2 (A through E) are waveform diagrams illustrating the operation of the circuit shown in Figure 1.

In accordance with the present invention, however, a source of control pulses 26, preferably having the characteristics shown in Figure 2A, may be coupled to the signal or input winding 22 via a rectifier D3, as shown. These control pulses are positive and negative-going and are so timed with respect to the signal pulses and the assumed operational signal periods that in the absence of signal inputs to the terminal 25, current from the source $+V-R_1$ regularly alternates between the rectifiers D2 and D3. Thus, referring to Figure 2, for the total time interval $t1$ to $t5$, it will be seen that during a time interval $t1$ to $t2$, the rectifier D3 is substantially cut off by a positive-going control pulse, while the terminal 25 is substantially at ground potential, whereby current flows through the rectifier D2 from the source $+V-R_1$ during this time interval. During a next successive time interval $t2$ to $t3$, a large negative potential is applied to the cathode of rectifier D3, whereby substantially all the current from the source $+V-R_1$ flows through the rectifier D3 rather than through the rectifier D2. This state of operation will continue so long as no positive-going signals are applied to the terminal 25, whereby during successive time intervals current alternately flows through the rectifiers D2 and D3.

If a signal input should be applied to the terminal 25 during a time interval $t5$ to $t6$, however, the rectifier D2 will be disconnected, whereby current from the source $+V-R_1$ will be coupled to the signal or input winding 22 during this time interval; and so long as signal pulses or potentials occur at the said input terminal 25 (time interval $t5$ to $t10$), the current from source $+V-R_1$ will be regularly alternated between the rectifier D3, and the winding 22 and rectifier D4, thus giving the desired input. Upon cessation of a signal input (time $t10$ et seq.), the signal input terminal returns to a potential level of ground, and in the absence of rectifier D3 and the control pulse source shown, the amplifier would tend to turn off during a relatively long fall time. A negative-going control pulse, however, is coupled to the terminal 26 during a time interval $t10$ to $t11$ and, due to the relatively large value of this negative-going control pulse potential, rectifier D3 conducts heavily and current transfer from the signal or input winding 22 is effected very rapidly, whereby the switching time of the amplifier is decreased considerably.

It should be noted that the negative voltages applied to terminal 26 may actually be made much larger than the signal value E, so that amplifiers in accordance with the present invention may in fact cut off more rapidly than they are turned on. It should further be noted that while substantially square wave control and signal pulses have been shown in Figure 2, these pulses may be of other configurations, such as a sinusoidal configuration, and the frequency of these signal and control pulses is substantially less than that of the carrier source.

The concepts of forcible "turn-off" discussed above, find utility not only in amplifier circuits per se, but in various forms of such amplifiers constructed to effect various operational characteristics. Thus, reference is made to the copending application of Richard W. Spencer, Serial No. 480,671, filed January 10, 1955, for "Magnetic Amplifier Flip-Flop Circuit." This copending application has been assigned to the assignee of the instant application and discloses carrier type magnetic amplifiers of both the single and plural core types, employing feedback circuits whereby the resulting device becomes a flip-flop with two stable states. When such feedback provisions are employed, the devices may exhibit a characteristic curve of the type shown generally in Figure 3, wherein an unstable negative slope region, lying between points X and Y, is effected. In accordance with this copending application, the device may accordingly be caused to operate at a bias point (bias B) whereby the device selectively exhibits two possible stable output conditions represented by the output potentials V1 and V2. In the operation of such devices, a positive-going input signal causes the device to move from its V1 operating point through the unstable region X—Y, to the V2 operating point, while a negative input signal causes the device to revert from its V2 operating point to its V1 operating point. Since signal sources are employed for effecting transfer between these two points in both directions, however, the bias B chosen is normally such that the curve is substantially symmetrical about a vertical axis, whereby substantially the same amount of signal power is required to turn the flip-flop "on" as is required to turn the flip-flop "off."

While such operation is generally acceptable, it should be noted that the foregoing operating characteristics often impose an undesirable restriction upon the signal source; and this restriction may be obviated by utilizing the concepts of the present invention. Thus, the device may be so modified that, once more, positive-going signal inputs are required to flip the device from a first to a second stable state only, and auxiliary control pulses may then be utilized to revert the device from its said second stable state to its original stable state. When this particular form of the present invention is utilized, the bias provided may cause the device to operate about a bias A point, for instance, as shown in Figure 3, whereby a relatively small amount of signal power is required to turn the flip-flop "on," and auxiliary control pulses supply the relatively large amount of power required to turn the device "off."

Theoretically, it would be possible to bias flip-flops in accordance with the present invention in such a manner that only a negligibly small signal power is required to flip the device from a first to a second stable state, and substantially all the power is supplied by control pulses for flipping the device from its second stable state back to its original stable state, whereby considerable savings in required signal power may be effected. In practice, however, stability considerations and noise considerations provide a limit upon the permissible value of bias A with respect to the operating point Y, but in any event, this value of bias A may be so chosen that susbtantially less signal power is required to turn the device "on" than was the case heretofore.

Figure 4:
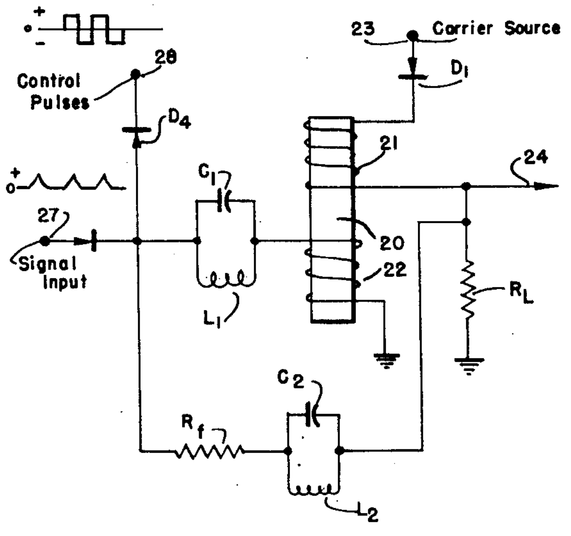
Figure 4 is a schematic diagram of a carrier type magnetic amplifier exhibiting bistable operation and constructed in accordance with the present invention.

Figure 4 illustrates a bistable device generally of the type shown in the above identified copending application and modified in the manner discussed above. Thus, such a device may again comprise a core 20 of magnetic material, having a power or output winding 21 coupled at one of its ends to a carrier source 23, via a rectifier D1 and coupled at the other of its ends to a load impedance RL, and to an output point 24. The device may further utilize a signal or input winding 22 coupled at one of its ends to ground, and coupled at the other of its ends to a signal source 27 providing selective positive-going signal inputs. A filter $C_1$—$L_1$ may further be provided to keep carrier frequency signals out of the signal source coupled to terminal 27. Outputs appearing across the load RL may further be fed back to the signal or input winding 22 via a further filter C2—L2 and a feedback impedance **R*f***, as shown, whereby the device exhibits a characteristic curve of the type shown in Figure 3, and operates in the manner described above. It should be noted, of course, that the particular feedback loop shown is illustrative only and other forms of feedback may be utilized.

Figure 3:
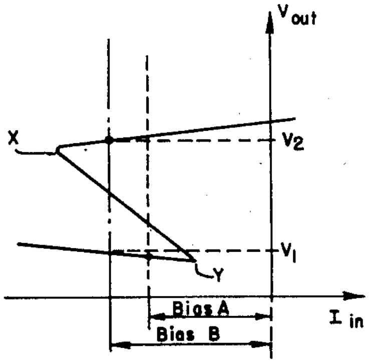
Figure 3 is a graphical representation of the characteristic operation of a bistable device employing magnetic amplifiers.

A source 28 of positive and negative-going control pulses may be coupled to the signal winding 22 via a rectifier D4; and a bias source, not shown, is further provided to cause operation of the device about a bias A operating point (Figure 3). As was discussed previously, in the absence of signal inputs, the device will operate at a first stable output point adjacent potential V1; and for this first condition of operation, the application of control pulses at the terminal 28 has no effect upon the output. A positive-going signal input applied at the terminal 27 causes the device to flip from its lower stable operating point to an upper stable output point adjacent V2; and a subsequently applied negative-going control pulse at the terminal 28 causes a reverse current flow from ground through winding 22 and thence through the filter $C_1$—$L_1$ and the rectifier D4, which reverse current flow causes the device to revert to its original stable state. Thus, in the absence of signal inputs, the device operates substantially at a first stable output point, while the presence of signal inputs causes the device to be regularly flipped between its two stable output conditions. Since the control pulses applied to terminal 28 may exhibit relatively large negative excursions, the device is characterized by a relatively low flipping time, and is further rendered substantially independent of the magnitude of signal input for effecting the flip from its second stable operating point to its original stable operating point.

While I have described preferred embodiments of the present invention, it must be understood that the foregoing description is means to be illustrative only and is not limitative of my invention. The concepts of forcible reversion may be utilized in respect to various amplifiers and amplifier circuits, not specifically shown; and further modifications will suggest themselves to those skilled in the art. All such modifications as are in accord with the foregoing principles are therefore meant to fall within the scope of the appended claims.

Having thus described my invention, I claim:

1. In a magnetic amplifier, a core of magnetic material having an input winding thereon, a source of selectively applied signals coupled to said input winding for effecting selective signal currents therein, a rectifier coupled to said input winding, and a source of variable potential coupled to said rectifier for by-passing currents from said input winding through said rectifier in the absence of signals from said signal source.

2. The magnetic amplifier of claim 1 wherein said source of variable potential comprises means producing regularly occurring control pulses whereby current flow is by-passed from said input winding during regularly occurring predetermined time intervals.

3. In a amplifier having an input, a source of selective signals coupled to said input for selectively causing the output of said amplifier to change from a predetermined no-signal state to a further output state, and pulse means coupled to said input for selectively reverting said amplifier to said no-signal output state subsequent to application of a signal from said signal source.

4. The amplifier of claim 3 wherein said pulse means includes rectifier means coupled to said input, and a regularly occurring pulse source coupled to one electrode of said rectifier whereby a relatively low impedance is regularly effected in parallel with said input.

5. The amplifier of claim 3 wherein said pulse means includes rectifier means coupled to said input, and a regularly occurring pulse source coupled to one electrode of said rectifier for regularly effecting a control input to said amplifier of a potential opposite that effected by said selective signals.

6. The arrangement of claim 3 wherein said amplifier comprises a magnetic amplifier having a core of magnetic material, said input comprising a control winding carried by said core.

7. A control system comprising a magnetic amplifier having a core of magnetic material, a control winding on said core, first means responsive to signal inputs for selectively effecting a current flow through said winding whereby the output of said amplifier changes from a predetermined no-signal state to a further output state, and second means coupled to said amplifier and responsive to the output state of said amplifier for reverting said amplifier from said further output state to said no-signal output state upon cessation of said signal inputs.

8. The control system of claim 7 including feedback means between the output and the said control winding of said amplifier whereby each of said no-signal and said further output states are stable states of operation, said second means comprising a source of variable potential for selectively effecting a current flow through said control winding in a direction opposite that effected by said signal inputs.

9. The control system of claim 7 wherein said second means comprises variable impedance means coupled to said control winding, and means for selectively changing the magnitude of said impedance thereby to reduce current flowing in said control winding upon cessation of said signal inputs.

10. The control system of claim 7 wherein said second means comprises a rectifier coupled to said control winding, and alternately positive and negative-going pulses coupled to one electrode of said rectifier for alternately connecting and disconnecting said rectifier with respect to said control winding.

11. In an amplifier having an input and an output, feedback means between said input and said output whereby said amplifier exhibits first and second stable operating states, a source of selective signals coupled to said input for causing the amplifier to change from said first to said second stable state, and control pulse means coupled to said amplifier and operative upon cessation of said signal inputs for reverting said amplifier from said second to said first stable state.

12. The amplifier of claim 11 wherein said amplifier comprises a core of magnetic material having plural windings thereon.

13. In a magnetic amplifier having an input and an output, signal means coupled to said input for selectively changing the output state of said amplifier from a predetermined no-signal state to a further output state, and a pulse source coupled to said amplifier and effectively operative subsequent to operation of said signal means for forcibly reverting the output state of said amplifier to said no-signal state.

14. The amplifier of claim 13 wherein said signal means comprises a substantially constant current source coupled to said input, and means responsive to the absence of input signals for selectively by-passing current from said current source away from said amplifier input.

15. The amplifier of claim 13 including feedback means between said output and said input whereby said no-signal and said further output states are stable states of operation.

16. The magnetic amplifier of claim 13 wherein said amplifier includes a core of magnetic material exhibiting a substantially rectangular hysteresis loop.

References Cited in the file of this patent

UNITED STATES PATENTS 2,709,798 Steagall -------------- May 31, 1955